United States Patent
Lehmann et al.

(10) Patent No.: US 12,429,504 B2
(45) Date of Patent: Sep. 30, 2025

(54) CURRENT SENSOR

(71) Applicant: Continental Automotive Technologies GmbH, Hannover (DE)

(72) Inventors: Sören Lehmann, Frankfurt am Main (DE); Michael Irsigler, Regensburg (DE); Anjana Gopinath, Maruthi Nagar (IN); Wolfgang Weigert, Tegernheim (DE); Manfred Frimberger, Ergoldsbach (DE)

(73) Assignee: Continental Automotive Technologies GmbH, Hannover (DE)

( * ) Notice: Subject to any disclaimer, the term of this patent is extended or adjusted under 35 U.S.C. 154(b) by 167 days.

(21) Appl. No.: 18/350,948

(22) Filed: Jul. 12, 2023

(65) Prior Publication Data
US 2024/0036082 A1    Feb. 1, 2024

(30) Foreign Application Priority Data
Jul. 29, 2022   (DE) .................... 10 2022 207 853.5

(51) Int. Cl.
*G01R 15/20*    (2006.01)
*B60L 3/00*     (2019.01)

(52) U.S. Cl.
CPC .......... *G01R 15/202* (2013.01); *B60L 3/0046* (2013.01); *G01R 15/207* (2013.01); *B60L 2240/549* (2013.01)

(58) Field of Classification Search
CPC .. G01R 15/202; G01R 15/207; G01R 31/364; G01R 31/387; B60L 3/0046
See application file for complete search history.

(56) References Cited

U.S. PATENT DOCUMENTS

| | | | |
|---|---|---|---|
| 10,184,958 B2* | 1/2019 | Ausserlechner | G01R 1/203 |
| 11,940,470 B2* | 3/2024 | Messier | H02K 11/27 |
| 2003/0001559 A1* | 1/2003 | Goto | G01R 15/202 |
| | | | 324/117 H |

(Continued)

FOREIGN PATENT DOCUMENTS

| | | |
|---|---|---|
| DE | 10060490 A1 | 6/2002 |
| DE | 102011088893 A1 | 6/2013 |

(Continued)

OTHER PUBLICATIONS

German Search Report dated for May 26, 2023, for the German Patent Applciation No. 10 2022 207 853.5 for which this application claims priority.

(Continued)

*Primary Examiner* — Dominic E Hawkins

(57) ABSTRACT

A current sensor, fora vehicle battery in a vehicle, with an electrical conductor which has a first connection and a second connection for contacting a power circuit of a vehicle. The current sensor includes a first current measurement device and a second current measurement device for measuring the current flowing over the electrical conductor. An evaluation circuit receives measurement values of the first current measurement device and/or the second current measurement device to output a current measurement signal proportional to the current. The first current measurement device utilizes a Hall effect sensor disposed within a constriction with a reduced cross section of the electrical conductor.

14 Claims, 2 Drawing Sheets

(56) References Cited

U.S. PATENT DOCUMENTS

| | | | |
|---|---|---|---|
| 2012/0262151 A1 | 10/2012 | Mandic et al. | |
| 2014/0210479 A1 | 7/2014 | Rink | |
| 2014/0212714 A1 | 7/2014 | Butzmann | |
| 2017/0261536 A1* | 9/2017 | Chae | G01R 15/146 |
| 2022/0283200 A1* | 9/2022 | Friedrich | G01R 15/202 |

FOREIGN PATENT DOCUMENTS

| | | |
|---|---|---|
| DE | 102014216419 A1 | 2/2016 |
| DE | 102014219238 A1 | 3/2016 |
| EP | 1213189 A1 | 6/2002 |
| EP | 2511714 A2 | 10/2012 |
| EP | 2732295 A1 | 5/2014 |
| JP | 2009281773 A | 12/2009 |
| KR | 20160111166 A | 9/2016 |

OTHER PUBLICATIONS

Extended Search Report dated Dec. 5, 2023 from corresponding European patent application No. 23184892.0.
Extended Search Report dated Dec. 5, 2023 from related European patent application No. 23184893.8.
Search Report dated May 25, 2023 from related German patent application No. 10 2022 207 854.3.
U.S. Appl. No. 18/361,448, filed Jul. 28, 2023, in the U.S. Patent and Trademark Office.
European Examination Report dated Feb. 3, 2025 corresponding with European Application No. 23184892.0.

* cited by examiner

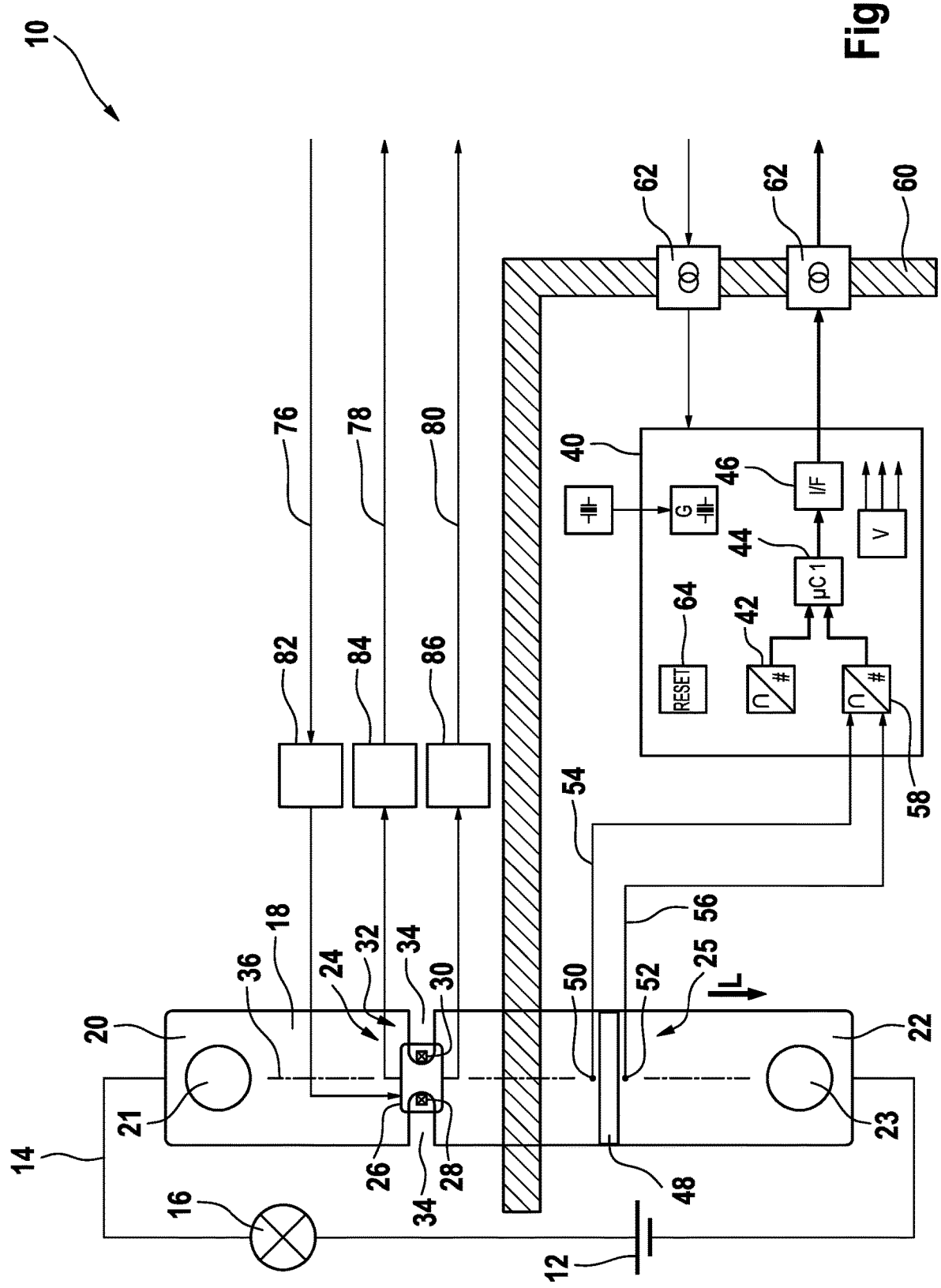

CURRENT SENSOR

CROSS-REFERENCE TO RELATED APPLICATIONS

The present application claims the priority from German Patent Application No. 10 2022 207 853.5 filed on Jul. 29, 2023, the content of which is herein incorporated by reference.

BACKGROUND

1. Field

Aspects of embodiments of the present application relate to a current sensor, in particular for a vehicle battery in a vehicle, with an electrical conductor which has a first connection and a second connection for contacting a power circuit of a vehicle, and with a first current measurement device and a second current measurement device for acquiring at least one measurement value for the current flowing over the electrical conductor, and with a first evaluation circuit which is connected to the first current measurement device and/or the second current measurement device and can receive the measurement values of the first current measurement device and/or the second current measurement device and output at least one current measurement signal depending on the measurement values.

2. Description of Related Art

In vehicles with batteries, in particular in electric vehicles or hybrid vehicles, in which batteries are used to supply energy to the drive unit, it is necessary to permanently monitor the batteries or their state during operation. It is in particular necessary to permanently monitor the state of charge of the batteries. Current sensors which are arranged in the current path and capture both the charging currents and the discharging currents of the batteries are used in the vehicles for this purpose.

In order to guarantee the reliability required in the automotive sector and to ensure the required accuracy of the current measurement, it is necessary to provide a redundant current measurement. This redundant current measurement is preferably effected using two independent physical measurement principles in order to avoid or minimize measurement errors due to systematic errors or due to errors which may be inherent in one measurement principle. The use of different measurement principles is also referred to as asymmetric redundancy. Such a sensor is shown, for example, in EP2732295A1.

The structure and the production of such sensors are, however, very costly.

SUMMARY

According to an aspect of an embodiment, there is provided a current sensor with a redundant current measurement which has a high degree of measurement accuracy and a high degree of reliability and is simple to produce.

According to an aspect of an embodiment, a current sensor, in particular for a vehicle battery in a vehicle, is provided, with an electrical conductor which has a first connection and a second connection for contacting a power circuit of a vehicle, and with a first current measurement device and a second current measurement device for acquiring at least one measurement value for the current flowing over the electrical conductor. The current sensor furthermore has a first evaluation circuit which is connected to the first current measurement device and/or the second current measurement device and can receive the measurement values of the first current measurement device and/or the second current measurement device and output a current measurement signal depending on the measurement values. The first current measurement device has a Hall effect sensor. The electrical conductor has a measurement portion, with a constriction with a reduced cross section, in the region of the first current measurement device, the Hall effect sensor being arranged in this constriction.

Use is usually made of a Hall effect sensor with an iron core which encloses the electrical conductor circumferentially. The Hall effect sensor is arranged in a gap of the iron core. A magnetic field which can be detected by the Hall effect sensor is generated in the iron core by the electric current which flows through the electrical conductor. The arrangement of such an iron core and the positioning of the Hall effect sensor require a lot of effort, however. According to aspects of the embodiments, a so-called difference Hall effect sensor is used instead of a Hall effect sensor with an iron core. A recess in which the Hall effect sensor is positioned is provided in the electrical conductor. The magnetic field generated in this constriction or in this recess by the electric current is strong enough that it can be detected by the Hall effect sensor. An iron core for generating or strengthening the magnetic field can thus be dispensed with. The current sensor can thus have a much more compact design. In addition, the structure is much simpler because only the Hall effect sensor has to be positioned and oriented in the recess. Additional orientation and positioning of the iron core and the Hall effect sensor on this iron core are not necessary.

In particular, the constriction is arranged such that a magnetic field which is as strong as possible and can be detected by the Hall effect sensor is provided inside the constriction. In particular, the geometry of the constriction can be determined by taking into account the geometrical shape of the electrical conductor, the measuring region, and the dimensions of the Hall effect sensor, or a desired strength of the magnetic field to be measured.

The constriction can be formed, for example, by at least one slot which extends from at least one face and/or one edge of the electrical conductor. Such a slot is simple to produce and enables simple positioning of the Hall effect sensor in this slot.

The constriction can be designed so that it is symmetrical with respect to a center axis, running in the current direction, of the electrical conductor, in particular mirror-symmetrical with respect to a plane running through the center axis. Influencing of the current lines or the potential lines which is asymmetrical, in particular mirror-symmetrical, with respect to the center axis consequently takes place such that a magnetic field which is as homogeneous as possible can be generated.

The electrical conductor can, for example, have a plate-shaped design and the constriction is formed by two slots which start from opposite edges of the conductor and extend into the electrical conductor symmetrically with respect to the center axis.

The second current measurement device preferably uses a different physical measurement principle than the first current measurement device. The second current measurement device can, for example, have a measuring resistor and at least one first measuring contact for detecting a first voltage potential and at least one second measuring contact for detecting a second voltage potential, the first measuring contact and the second measuring contact being arranged offset in the current direction. In particular, the first measuring contact can be arranged upstream from the measuring resistor and the second measuring contact arranged downstream from the measuring resistor in the longitudinal direction of the electrical conductor. The voltage drop across the measuring resistor can be calculated by means of the measured voltage potentials. The known electrical resistance of the measuring resistor or a measuring section between the measuring contacts and the measured voltage drop can be used to calculate the current flowing over the measuring resistor or the measuring section, i.e. the electrical conductor, using Ohm's law.

The second current measurement device is preferably arranged electrically in series with the first current measurement device. In particular, a symmetrical design of the constriction of the first current measurement device can also be advantageous for the second measurement device because a symmetrical influencing of the current lines or the potential lines is effected thereby.

Both current measurement devices are contacted, for example, with the first evaluation circuit which processes the measurement values of both current measurement devices and generates a common current measurement signal or a current measurement signal for each of the current measurement devices.

A second evaluation circuit can additionally be provided, a communications link being provided between the first evaluation circuit and the second evaluation circuit. The first evaluation circuit can send a first test signal to the second evaluation circuit and/or the second evaluation circuit can send a second test signal to the first evaluation circuit. The first evaluation circuit can check the second test signal and/or the second evaluation circuit can check the first test signal. The first evaluation circuit can send a first correction signal when the second test signal deviates from a second reference value, and the second evaluation circuit can send a second correction signal when the first test signal deviates from a first reference value.

The second evaluation circuit can have just the function of a monitoring circuit and not evaluate the measurement values of the current measurement devices. However, the second evaluation circuit can optionally also receive the measurement values of the current measurement devices and evaluate them.

In principle, the first and the second evaluation circuit have the function of monitoring each other and, in the case of a malfunction of the respective other evaluation circuit, of taking suitable measures in order to remedy the malfunction of the respective other evaluation circuit. If one of the evaluation circuits identifies a malfunction of the respective other evaluation circuit, a correction signal is sent, by virtue of which a suitable measure is taken for the respective other evaluation circuit.

An increased level of safety inside the current sensor is provided by the mutual checking of the evaluation circuits because malfunctions inside the current sensor can be identified and corrected.

The communications link is, for example, a bidirectional link, the test signals of both evaluation circuits being sent via this link. However, the communications link can also have a plurality of lines, for example a separate line for each test signal, in order to be able to identify errors in the communications link.

For example, the first evaluation circuit can have a first correction circuit for receiving the first correction signal and the second evaluation circuit can have a second correction circuit for receiving the second correction signal, the first correction circuit being provided for triggering a correction procedure for the first evaluation circuit and the second correction circuit being provided for triggering a correction procedure for the second evaluation circuit. The measures for correcting the malfunction are taken, after initiation by the respective other evaluation circuit with the correction signal, by the respective evaluation circuit itself, wherein, by sending the test signal, a check by the respective other evaluation circuit can then take place as to whether the correction of the malfunction was successful.

The correction procedure comprises, for example, a restart of the evaluation circuit and/or a reset of the evaluation circuit. In particular, the first evaluation circuit and/or the second evaluation circuit can have a first or a second correction circuit which receives the correction signal and takes corrective measures, in particular a restart or a reset of the respective evaluation circuit. An additional correction circuit ensures that the triggering of the corrective measures is not prevented by a faulty evaluation circuit itself.

The test signal can contain various pieces of information which enable a diagnosis of the respective other evaluation circuit. Reference values are preferably stored in the respective evaluation circuit for the information sent with the test signal or they are received or calculated by the respective evaluation circuit itself. In particular, threshold values, by which the information can deviate from the reference values, can be defined for the information.

In particular, the test signals are sent periodically, in particular at regular time intervals. Consequently, the absence of a test signal can additionally be detected and identified as a malfunction of the respective evaluation circuit. A request signal which causes the respective evaluation circuit to send the test signal can optionally also be sent.

For example, additional information can also be requested via the request signal in order to be able to perform a more accurate diagnosis of the respective other evaluation circuit.

For example, the first test signal contains status information and/or operating information of the first evaluation circuit and/or the second test signal contains status information and/or operating information of the second evaluation circuit. If this status information and/or this operating information deviates from previously defined parameters, it has to be assumed that there is a malfunction of the respective evaluation circuit such that corrective measures are necessary.

The first test signal can also contain measurement values and/or a current measurement signal of the first evaluation circuit and/or the second test signal can contain measurement values and/or a current measurement signal of the second evaluation circuit. By comparing the measurement values and/or the current measurement signals, it is possible to check not only whether the respective evaluation circuit is functioning but also whether it correctly receives and evaluates the measurement values of the respective current measurement device.

The first test signal and/or the second test signal can furthermore contain status information and/or operating information of the first current measurement device and/or the second current measurement device.

In order to improve the reliability of the current sensor or the functional check, the first evaluation circuit and the second evaluation circuit can have separate power supplies and/or separate outlets for a current measurement signal. A split power supply to the two evaluation circuits can ensure that functional errors due to a faulty voltage supply do not affect both evaluation circuits. A malfunction of one of the two evaluation circuits can consequently be identified more reliably. The separate outlets for the current measurement signal enable the separate output of the current measurement signals. They can consequently be sent, for example, via the communications link or made available separately to a higher-level vehicle control system. In particular, further processing of the current measurement signals can take place in a higher-level vehicle control system, for example additional comparison of the measurement values or the current measurement signals of both evaluation circuits.

In principle, the current sensor can evaluate the measurement values of both current measurement devices and output either a current measurement signal from the measurement values of both current measurement devices or separate current measurement signals for both current measurement devices.

The current sensor can optionally also have a first communications interface for outputting the measurement values of the first current measurement device and a second communications interface for the current measurement signal of the second current measurement device. In this embodiment, the measurement values of the first current measurement device are not evaluated and instead only output such that they can be evaluated, for example by a downstream vehicle control system. The measurement values of the second current measurement device are, in contrast, evaluated and only a current measurement signal output.

This embodiment can have many advantages. On the one hand, the function of the current sensor, in particular the evaluation circuit, can additionally be checked by evaluating the measurement values outside the current sensor.

The measurement values and/or the current measurement signals can each be output in analog or digital form. For example, the current measurement signals of the second current measurement device are output digitally and the measurement values of the first current measurement device are output in analog form, in particular without any prior processing or evaluation.

Because of the high voltages and currents, it may be necessary to secure parts of the current sensor, in particular of the evaluation circuit, against voltage flashover with respect to the communications interfaces and a downstream vehicle control system, for example by galvanic isolation. In particular, in the case of a second current measurement device with a measuring resistor, the measuring contacts are in direct contact with the electrical conductor and with the evaluation circuit such that the evaluation circuit must be protected in particular against voltage flashover to the vehicle control system or other parts of the current sensor. A Hall effect sensor, in contrast, works contactlessly such that there may be no need to protect it against voltage flashover. Because the first current measurement device in this embodiment has a separate communications interface for outputting the measurement values, an electrical connection to one of the evaluation circuits is not necessary. Insulation or protection with respect to the regions which can come into contact with a high voltage is thus not necessary. The current sensor can consequently be configured with a much simpler structure. It is in particular not necessary to protect the communications interface of the first current measurement device additionally against voltage flashovers.

Regardless of the embodiment, however, the first communications interface and/or the second communications interface can also have protection devices against a positive and/or negative overvoltage and/or for potential separation.

The first evaluation circuit and/or the second evaluation circuit can furthermore have insulation, in particular galvanic isolation, by means of which the first evaluation circuit and/or the second evaluation circuit is insulated with respect to other regions of the current sensor or other parts of a vehicle.

BRIEF DESCRIPTION OF THE DRAWINGS

Further advantages and features will be understood from the following description in conjunction with the appended drawings, in which:

FIG. 2 is a diagram of a second embodiment of a current sensor according to an embodiment.

DETAILED DESCRIPTION

Figure 1:
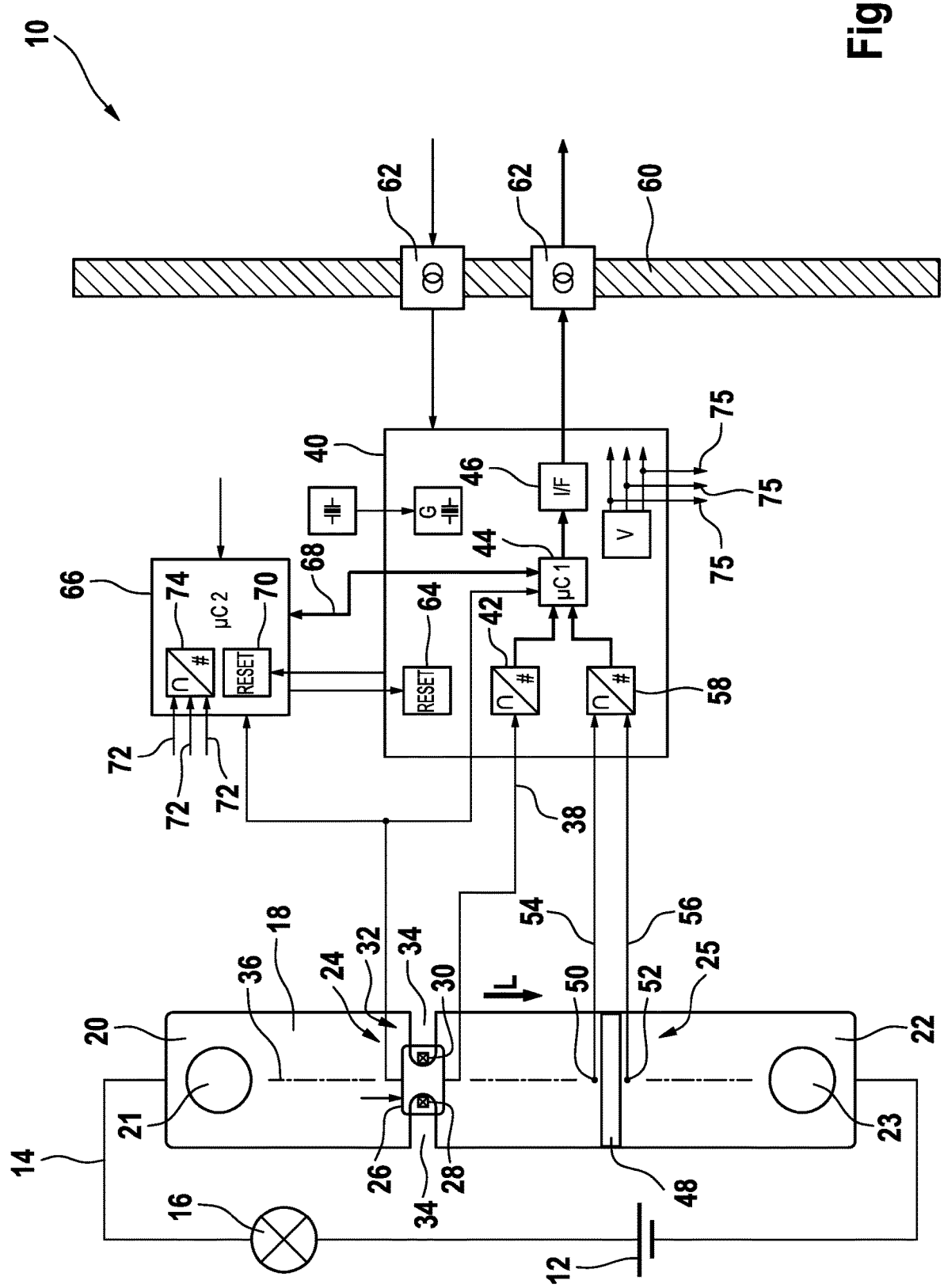
FIG. 1 is a diagram of a first embodiment of a current sensor according to an embodiment.

FIG. 1 shows a battery sensor 10 for a vehicle battery 12 in a vehicle. The battery sensor 10 is arranged in a power circuit 14 in which the vehicle battery 12 and at least one consumer 16 are situated, the battery sensor 10 being arranged such that all the charging currents and discharging currents of the vehicle battery 12 can flow over the battery sensor 10 and thus be measured by the latter. A very accurate statement regarding the state of charge of the vehicle battery 12 is possible using the measured charging currents and discharging currents.

The battery sensor 10 has an electrical conductor 18 which is arranged in the power circuit 14 and has a first connection 20 and a second connection 22. The connections 20, 22 can have, for example, a bore 21, 23 for a screw connection to the power circuit 14.

The battery sensor 10 furthermore has a first current measurement device 24 and a second current measurement device 25 which can calculate the current flowing over the electrical conductor 18.

The first current measurement device 24 has a Hall effect sensor 26 with a first Hall cell 28 and a second Hall cell 30. The electrical conductor 18 has a constriction 32, which is formed by two slots 34 extending from opposite edges of the electrical conductor, in the region of the Hall effect sensor 26.

The slots 34 are arranged symmetrically with respect to a center axis 36 extending in the longitudinal direction L of the electrical conductor. The slots 34 are arranged such that in each case one of the Hall cells 28, 30 of the Hall effect sensor 26 is situated in one of the slots 34 or is arranged in the immediate vicinity of the latter.

A magnetic field which can be detected by the Hall effect sensor 26 is created around the electrical conductor 18 and in the constriction 32 by the current which flows through the electrical conductor 18. The magnetic field changes with the current which flows through the electrical conductor 18 such that the current flowing through the electrical conductor 18 can be determined from the strength of the magnetic field and the change in the magnetic field. An iron core is usually arranged around the electrical conductor 18 in order to provide a magnetic field which is strong enough that it can be detected by the Hall effect sensor 26. In the embodiment shown here, a constriction 32 in which the Hall effect sensor 26 is arranged is used instead of an iron core. The Hall effect sensor 26 is a so-called difference Hall effect sensor which can be used to detect the magnetic field created by the current in the constriction 32. It is consequently possible to dispense with an additional iron core.

The Hall effect sensor 26 is connected via a communications line 38 to a first evaluation circuit 40. The evaluation circuit 40 can receive the measurement values of the Hall effect sensor 26 which are received from the Hall effect sensor 26 via the communications line 38, evaluate them, and generate from them a current measurement signal which is, for example, proportional to the current flowing over the electrical conductor 18.

For this purpose, the evaluation circuit 40 has a first analog-to-digital converter 42 and a first microcontroller 44. The current measurement signals generated by the microcontroller 44 can then be output via a first communications interface 46, for example to a downstream vehicle control system.

The second current measurement device 25 has a measuring resistor 48 arranged in the current path. A first measuring contact 50 and a second measuring contact 52, which can each detect a voltage potential at the electrical conductor 18, are provided upstream and downstream from the measuring resistor 48 in the longitudinal direction L, i.e. in the current direction. The measuring contacts 50, 52 are connected to the first evaluation circuit 40 via communications lines 54, 56. The evaluation circuit 40 has a second analog-to-digital converter 58 which is connected to the microcontroller 44.

The voltage drop across a measuring section defined between the measuring contacts 50, 52 or across the measuring resistor 48 can be measured from the voltage potentials of the measuring contacts 50, 52 via the analog-to-digital converter 58 and the microcontroller 44. This voltage drop and the known resistance of the measuring section or the measuring resistor 48 can be used to calculate the current flowing over the measuring section or the measuring resistor 48, i.e. the current flowing over the electrical conductor 18, using Ohm's law.

The microcontroller 44 can output the current measurement signals, calculated from the measurement values of the first current measurement device 24 and the second current measurement device 25, individually or jointly to the communications interface 46 such that they can be output to a vehicle control system.

In addition, further adjustments to the measurement values and/or the current measurement signals, for example a calibration or a temperature compensation, can be made in the microcontroller 44.

As can be seen in particular in FIG. 1, a potential separation zone 60 is provided in order to avoid voltage flashover between the regions of the current sensor 10 which are in contact with the electrical conductor 18 and a vehicle electronic system or a vehicle control system. The potential separation zone has a protection device 62 in order to be able to transmit the current measurement signals to a vehicle electronic system or a vehicle control system in the case of sufficiently high protection against voltage flashover. The communications interface 46 can, for example, also be integrated into the protection device 62.

The first evaluation circuit 40 furthermore has a correction circuit 64 via which suitable measures can be initiated in the case of a malfunction of the evaluation circuit 40 in order to remedy the malfunction of the evaluation circuit 40. For example, the correction circuit 64 can restart or reset the evaluation circuit 40.

A second evaluation circuit 66 is furthermore provided and is connected to the first evaluation circuit 40 via a communications link 68. The communications link 68 is, for example, a bidirectional communications line via which information can be exchanged between the first evaluation circuit 40 and the second evaluation circuit 66.

The second evaluation circuit 66 furthermore has a second correction circuit 70 and at least one inlet 72 for operating information of the current sensor 10, for example of the microcontroller 44, of the evaluation circuit 40, of the first current measurement device 24, and/or of the second current measurement device 25. The inlet 72 is connected to an analog-to-digital converter 74.

The first evaluation circuit 40 and the second evaluation circuit 66 can exchange information via the communications link 68 in order to check the proper operating state of the respective other evaluation circuit 66, 40. Each evaluation circuit 40, 66 preferably sends via the communications link 68 a test signal with previously defined information which is checked by the respective other evaluation circuit 66, 40. If the information contained in the test signal does not match the information which is stored in the evaluation circuit 66, 40 or is received or calculated by the latter, a correction signal is sent to the correction circuit 64, 70 of the respective other evaluation circuit 40, 66. For example, the respective evaluation circuit 40, 66 is restarted or reset on the basis of this correction signal.

The test signals can, for example, contain operating information or status information of the first current measurement device 24, of the second current measurement device 25, and/or of the respective other evaluation circuit 40, 66.

If operating information or status information of the first current measurement device 24 and/or of the second current measurement device 25 is contained in the test signal, it can be received and processed or evaluated by both evaluation circuits 40, 66. The processed or evaluated operating information or status information can then be transmitted with the test signal via the communications link to the respective other evaluation circuit 40, 66. The latter can compare the information contained in the test signal with the information evaluated by the independent evaluation circuit 40, 66. If the evaluated information differs from each other, it has to be assumed that the evaluation in the evaluation circuit 40, 66 is incorrect and hence the evaluation circuit 40, 66 is not working correctly. If this is the case, a correction signal can then be generated by the respective other evaluation circuit 66, 40 and sent to the evaluation circuit 40, 66.

The operating information or status information is, for example, operating voltages of the first current measurement device 24, of the second current measurement device 25, and/or of the evaluation circuit 40, 66. The operating voltages of the current measurement devices 24, 25 are, for example, provided by the first evaluation circuit 40 such that a check can also be made using the above-described method as to whether the correct operating voltages are provided. In particular, in this embodiment the operating voltages of the current measurement device 24, 25 can be sent directly via an outlet 74 to the second evaluation circuit 66 or the inlet 72 of the second evaluation circuit 66 and checked by the latter.

Alternatively, the test signals can also contain measurement values and/or information calculated from the measurement values, for example a current measurement signal. The measurement values received by the two evaluation circuits 40, 66 and/or the evaluated information can be compared with each other. If they differ from each other, it has to be assumed that there is a malfunction of the evaluation circuit 40, 66.

The test signals are, for example, sent periodically at previously defined time intervals. The absence of a test signal or delayed sending of a test signal can consequently also be evaluated as a malfunction of the respective evaluation circuit 40, 66.

In particular, after sending the correction signal and a subsequent restart or reset of the evaluation circuit 40, 66, a new test signal can also be immediately sent in order to check whether the restart or the reset of the evaluation circuit 40, 66 was successful and the malfunction has been remedied. In such a case, a test signal can, for example, also be requested from the evaluation circuit 40, 66 via the communications link 68.

The embodiment shown in FIG. 2 likewise has an electrical conductor 18 with a first current measurement device 24 and a second current measurement device 25. The functioning of the current measurement devices 24, 25 corresponds to the embodiment shown in FIG. 1. The first current measurement device 24 has a Hall effect sensor 26. The second current measurement device 25 has a measuring resistor 48 and two measuring contacts 50, 52. A first evaluation circuit 40 is furthermore provided and is connected to the measuring contacts 50, 52 of the second current measurement device 25. The structure of the first evaluation circuit 40 corresponds substantially to the first evaluation circuit 40 shown in FIG. 1.

In contrast to the embodiment shown in FIG. 1, however, the Hall effect sensor 26 has a separate voltage supply 76 and separate second communications interfaces 78, 80 for outputting the measurement values and/or an error signal, operating information, and/or status information.

The communications interface 78 can output the measurement values of the Hall effect sensor 26 unchanged, for example to a vehicle control system. The measurement values of the Hall effect sensor 26 can be evaluated or processed in the vehicle control system. The evaluated measurement values of the Hall effect sensor 26 can then be compared with the current measurement signals, output via the first communications interface 46, of the second current measurement device 25.

As can be seen in FIG. 2, the communications interfaces 78, 80 and the voltage supply 76 have protection devices 82, 84, 86 against a positive and/or negative overvoltage.

Furthermore, just the first evaluation circuit 40 is provided in the potential separation zone 60. Because the measuring contacts 50, 52 are in direct contact with the electrical conductor 18, it is also necessary in this embodiment to separate or insulate them relative to the other regions of the current sensor and relative to a vehicle control system. Because the Hall effect sensor 26 measures contactlessly and thus is not in conductive contact with the electrical conductor 18, it can be arranged outside the potential separation zone 60. Additional protection against a positive and/or negative overvoltage is nevertheless provided by the protection devices 82, 84, 86.

Furthermore, no communications link 68 is provided in the embodiment shown here. The measurement values, the current measurement signals, the operating information, and/or the status information can be compared in the vehicle control system in this embodiment. For this reason, information from which a test signal can be calculated, for example error signals, operating information, or status information of the Hall effect sensor 26, is, for example, output via the communications interface 80. The information of the first evaluation circuit 40 can furthermore be output unprocessed or as a test signal via the first communications interface 46.

The invention claimed is:

1. A current sensor comprising:
an electrical conductor comprising a first connection and a second connection configured to contact a battery, the electrical conductor comprising a constriction of reduced cross section bridging the first connection and the second connection;
a current measurement device configured to measure a current flowing over the electrical conductor, the current measuring device comprising a Hall effect sensor disposed within the constriction, the Hall effect sensor configured to detect a magnetic field created by the current in the constriction and output a measurement value of the magnetic field;
an evaluation circuit configured to receive the measurement value and output a current measurement signal proportional to the current; and
a second current measurement device arranged in series with the first current measurement device configured to measure the current flowing over the electrical conductor comprising:
a resistor arranged in a current path of the current;
a first measuring contact provided upstream of the resistor; and
a second measuring contact provided downstream of the resistor,
wherein the first measuring contact and the second measuring contact are configured to detect a voltage potential at the electrical conductor, and
wherein the evaluation circuit is configured to output a second current measurement signal proportional to the current based on a voltage drop defined between the first measuring contact and the second measuring contact, or based on a voltage drop across the measuring resistor.

2. The current sensor as claimed in claim 1, wherein the constriction comprises a first slot extending inwardly from a first edge of the electrical conductor and a second slot opposing the first slot extending inwardly from a second edge of the electrical conductor.

3. The current sensor as claimed in claim 2, wherein the constriction is symmetrical with respect to a center axis running in the longitudinal direction of the electrical conductor.

4. The current sensor as claimed in claim 3, wherein the first measuring contact and the second measuring contact are arranged offset in the longitudinal direction.

5. The current sensor as claimed in claim 4, further comprising a second evaluation circuit,
wherein the evaluation circuit is configured to send a test signal to the second evaluation circuit, and
wherein the second evaluation circuit is configured to check whether the test signal deviates from a reference value and send a correction signal to the evaluation circuit when the test signal deviates from the reference value.

6. The current sensor as claimed in claim 5, wherein the evaluation circuit comprises correction circuit for receiving the correction signal, and
wherein the correction circuit is configured to trigger a correction procedure for the evaluation circuit based on the correction signal.

7. The current sensor as claimed in claim 6, wherein the correction procedure comprises a reset of the evaluation circuit.

8. The current sensor as claimed in claim 7, wherein the test signal contains status information of the evaluation circuit.

9. The current sensor as claimed in claim 8, wherein the status information comprises measurement values of the evaluation circuit.

10. The current sensor as claimed in claim 9, wherein the status information comprises status information of the current measurement device or the second current measuring device.

11. The current sensor as claimed in claim 10, further comprising a power supply configured to supply power to the evaluation circuit.

12. The current sensor as claimed in claim 11, further comprising a communications interface configured to output at least one of the current measurement signal and the second current measurement signal.

13. The current sensor as claimed in claim 12, further comprising a protection device configured to protect against a positive and/or negative overvoltage.

14. The current sensor as claimed in claim 13, further comprising galvanic isolation of the evaluation circuit and the second evaluation circuit.

* * * * *